(12) United States Patent
Dekker

(10) Patent No.: US 6,239,660 B1
(45) Date of Patent: May 29, 2001

(54) STEP-CONTROLLED FREQUENCY SYNTHESIZER

(75) Inventor: André Dekker, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/497,991

(22) Filed: Feb. 4, 2000

Related U.S. Application Data

(63) Continuation of application No. PCT/FI98/00612, filed on Aug. 4, 1998.

(30) Foreign Application Priority Data

Aug. 6, 1997 (FI) .......................................... 973248

(51) Int. Cl.⁷ ............................... H03L 7/06; H03L 7/18; H03L 7/185
(52) U.S. Cl. .................................................. 331/18; 331/25
(58) Field of Search .......................................... 331/18, 25

(56) References Cited

U.S. PATENT DOCUMENTS

| | | |
|---|---|---|
| 3,902,132 | 8/1975 | Fried ...................................... 331/15 |
| 4,320,357 | 3/1982 | Wulfsberg, et al. .................... 331/16 |
| 4,965,533 * | 10/1990 | Gilmore ................................. 331/18 |
| 5,028,887 | 7/1991 | Gilmore ................................. 331/18 |
| 5,142,246 | 8/1992 | Petersson .............................. 331/11 |
| 5,371,480 | 12/1994 | Hedberg et al. ........................ 331/16 |
| 5,801,589 * | 9/1998 | Tajima et al. ......................... 331/1 R |
| 5,831,481 * | 11/1998 | Oga ...................................... 331/1 A |

FOREIGN PATENT DOCUMENTS

| | | |
|---|---|---|
| 43 20 087 | 8/1994 | (DE) . |
| 0 492 588 | 7/1992 | (EP) . |
| 0 543 186 | 5/1993 | (EP) . |
| 0 793 348 | 9/1997 | (EP) . |
| 5-211440 | 8/1993 | (JP) . |
| 9-18336 | 1/1997 | (JP) . |

* cited by examiner

Primary Examiner—Siegfried H. Grimm
(74) Attorney, Agent, or Firm—Altera Law Group, LLC

(57) ABSTRACT

A method of controlling a frequency synthesizer and a frequency synthesizer having a controllable output signal frequency and including a direct digital synthesizer whose output signal is coupled to the input of a phase-locked loop. To reduce the settling time of the synthesizer, the direct digital synthesizer includes a control circuit for controlling the frequency of the direct digital synthesizer from a first frequency to a second frequency in accordance with predetermined frequency steps.

7 Claims, 4 Drawing Sheets

STEP-CONTROLLED FREQUENCY SYNTHESIZER

This application is a continuation of international application Ser. No. PCT/FI98/00612, filed Aug. 4, 1998.

FIELD OF THE INVENTION

The invention relates to a frequency synthesizer having a controllable output signal frequency and comprising a direct digital synthesizer whose output signal is coupled to the input of a phase-locked loop.

BACKGROUND OF THE INVENTION

In electronics, a frequency synthesizer is a common component for generating signals having different frequencies e.g. in radio transmitters or receivers. A frequency synthesizer is usually implemented by a phase-locked loop. FIG. 1 shows a known implementation of a frequency synthesizer. A frequency synthesizer comprises a direct digital synthesizer 100 whose output 106 is coupled to the input of a phase-locked loop 102. A control signal 104 indicating the frequency the synthesizer shall generate is applied to the direct digital synthesizer.

A direct digital synthesizer is capable of very fast switching, or changing, of its output frequency. A typical switching value is below 1 µs, but the signal generated thereby often contains too much noise and interference for telecommunication applications. Furthermore, only relatively low frequencies (about 100 MHz) can be achieved by digital synthesizers using present technology. This is why it is common to have a digital synthesizer followed by a phase-locked loop coupled in series. The phase-locked loop serves to purify the spectrum of the frequency synthesizer and transfer the frequency of the digital synthesizer to another, often higher, frequency. The phase-locked loop improves the spectrum of the frequency synthesizer by virtue of the loop filter, and with the help of the phase-locked loop the output signal of the frequency synthesizer to be shifted to the desired frequency range.

A problem in a phase-locked loop is that when the output frequency is changed, the loop is slow and it is often difficult to find the right compromise between the settling time of the phase-locked loop and suppression of noise and interference.

Some solutions are provided to solve the above problem. A known method increases the bandwidth of the phase-locked loop when the loop settles to a new frequency. The dual-speed loop filter required by such a solution is difficult to dimension, and the interference peaks from the required switches cause interference. At the moment of bandwidth change, the switches inject a charge into the loop filter capacitors. This results in a voltage step to the output of the voltage-controlled oscillator. With the phase-locked loop switched to slow operation mode, the voltage step will damp out only very slowly.

A known solution employs two phase detectors and two loop filters having different speeds and operated in parallel. The high-speed loop is used only when phase error is high, i.e. during the first part of synchronization. The low-speed loop is used when phase error is low, i.e. during the final part of synchronization and after synchronization. U.S. Pat. No. 5,142,246 discloses such a method. The large number of extra components required in this method is a drawback that makes the implementation expensive.

In another known solution, one or more division ratios in a phase-locked loop are adjusted during synchronization to compensate for one or more poles of the phase-locked loop transfer function, whereby the settling time shortens without increasing loop filter bandwidth. U.S. Pat. No. 5,371,480 teaches such a method. To simplify, the abrupt frequency step which appears at the input of the loop phase detector is predistorted to achieve an abrupt change in the output frequency of the loop. In order for this method to be effective, i.e. the predistorion to have sufficient resolution, the division factors of the phase-locked loop have to be relatively high. This is not a problem in conventional phase-locked loops, but when direct digital synthesizers are used with phase-locked loops, a high frequency resolution is obtained in the digital synthesizer, not in the phase-locked loop. In these cases the phase-locked loop is usually designed for high speed to keep the advantage of the fast switching of the digital synthesizer. In some cases a digital synthesizer is also used as a phase modulator. In this case, too, the phase-locked loop has to be fast for the phase modulation not to be distorted. To keep the phase noise of the phase-locked loop as low as possible, in spite of speed, small division factors must be chosen. This means that the frequency resolution of the phase-locked loop is not sufficiently high for pole compensation.

BRIEF DESCRIPTION OF THE INVENTION

It is the object of the invention to provide a frequency synthesizer and a method of controlling the frequency synthesizer to solve the above problems. This is achieved by a frequency synthesizer of the type described in the introduction, characterized in that the direct digital synthesizer comprises means for controlling the frequency of the direct digital synthesizer from a first frequency to a second frequency in accordance with predetermined frequency steps.

The invention also relates to a method of controlling a frequency synthesizer comprising generating a first frequency by means of a direct digital synthesizer, and generating a second frequency by means of a phase-locked loop, the first frequency being an input signal of the phase-locked loop, and an output signal of the phase-locked loop at the second frequency being an output signal of the frequency synthesizer. The method of the invention is characterized in that when the second frequency is changed, the direct digital synthesizer is controlled so that the first frequency changes stepwise in accordance with a desired predetermined response.

The preferred embodiments of the invention are disclosed in the dependent claims.

The invention is based on the idea that when the frequency of a signal at the input of a phase-locked loop is switched, the switching step is predistorted to compensate for the step response of the loop. The predistortion is carried out by controlling the direct digital synthesizer.

The frequency synthesizer of the invention provides several advantages. As the frequency of a signal at the input of a phase-locked loop is predistorted, the settling time of the loop shortens without any change in bandwidth. The analog structure of the device does not become more complex. Furthermore, since the distortion is carried out by means of a direct digital synthesizer, a sufficient frequency resolution is achieved without high division factors in the phase-locked loop. Low division factors reduce phase noise.

BRIEF DESCRIPTION OF THE FIGURES

In the following the invention will be described in greater detail by preferred embodiments with reference to the attached drawings, in which.

DETAILED DESCRIPTION OF THE INVENTION

Figure 2:
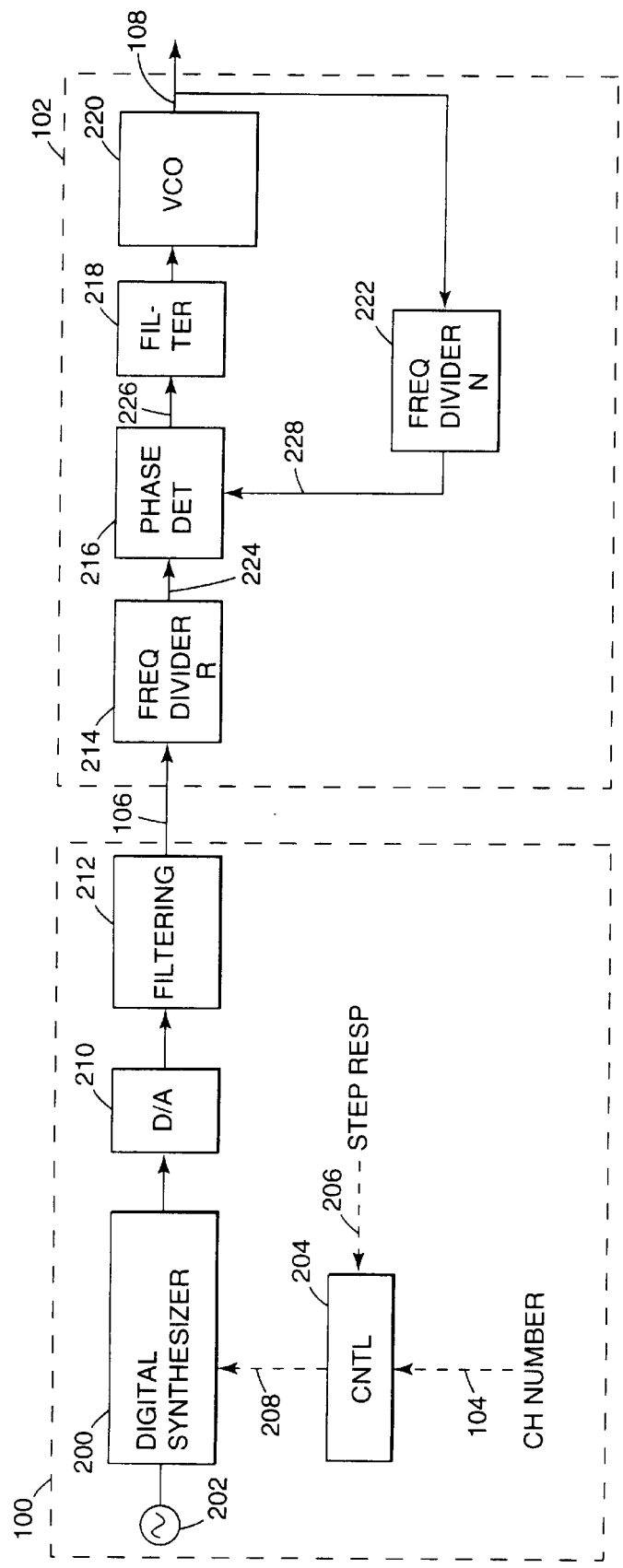
FIG. 2 shows an example of the structure of the frequency synthesizer of the invention.

Let us next study FIG. 2 which shows the frequency synthesizer according to a preferred embodiment of the invention. The frequency synthesizer of the invention comprises a direct digital synthesizer 100 and a phase-locked loop 102, coupled in series. The direct digital synthesizer 100 comprises an actual synthesizer block 200, which generates the desired frequency in digital form. The synthesizer block 200 can be implemented in a known manner. A signal is applied as an input to the synthesizer block from an oscillator or a corresponding frequency source 202. The direct digital synthesizer 100 further comprises control means 204 for controlling the operation of the synthesizer block 200. The control means can be implemented by a processor, for example. Information 104 indicating the frequency the synthesizer should generate is applied as an input to the control means. A second input 206 is the desired step response at the output of the direct digital synthesizer 100. This will be described in more detail below. Since the signal generated by the synthesizer block 200 is in digital form, the direct digital synthesizer further comprises a digital/analog converter 210. An output signal of the D/A converter is applied to a filter 212 which filters off unnecessary harmonic signals. From the filter 212 the signal $f_{DDs}$ 106 is applied to the phase-locked loop 102.

The phase-locked loop 102 comprises a frequency divider 214, which divides the signal by a division number R to obtain a reference signal 224. The reference signal 224 is applied to a phase detector 216. The phase detector compares the reference signal 224 with an output signal 228 of a second frequency divider 222. As a result of the comparison, the output of the phase detector comprises an error signal 226 which is responsive to the phase error of the input signals of the phase detector. This signal is applied to a filter 218. After filtering, the error signal is applied to a voltage-controlled oscillator 220, which is responsive to the error signal and generates an output signal $f_{VCO}$ 108. The output signal is also applied to the second frequency divider 222 which divides the signal by a division number N. The signal 228 divided in the frequency divider is applied as a second input to the phase detector, as was described above. In the above solution the output signal $f_{VCO}$ 108 of the frequency synthesizer accordingly has the following form $$f_{VCO} = \frac{N}{R} f_{DDS}.$$

The frequency of the output signal $f_{VCO}$ 108 of the frequency synthesizer is switched by controlling the direct digital synthesizer. The control takes place by means of a signal 104 indicating to the control means 204 the frequency or channel number to which the frequency of the synthesizer should switch. In the solution of the invention, a step response via which switching to the desired frequency takes place is also applied as an input to the control means. In prior art solution, one step has been used in switching to a new frequency. In the solution of the invention, several small steps are used in switching to the new frequency, enabling a reduction of the settling time of the phase-locked loop.

Figure 1:
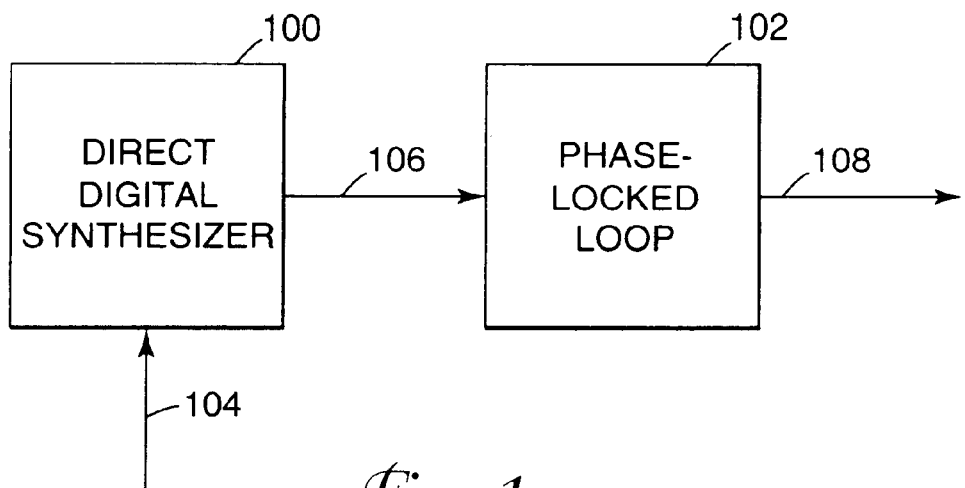
FIG. 1 shows the above described prior art solution.
Figure 3:
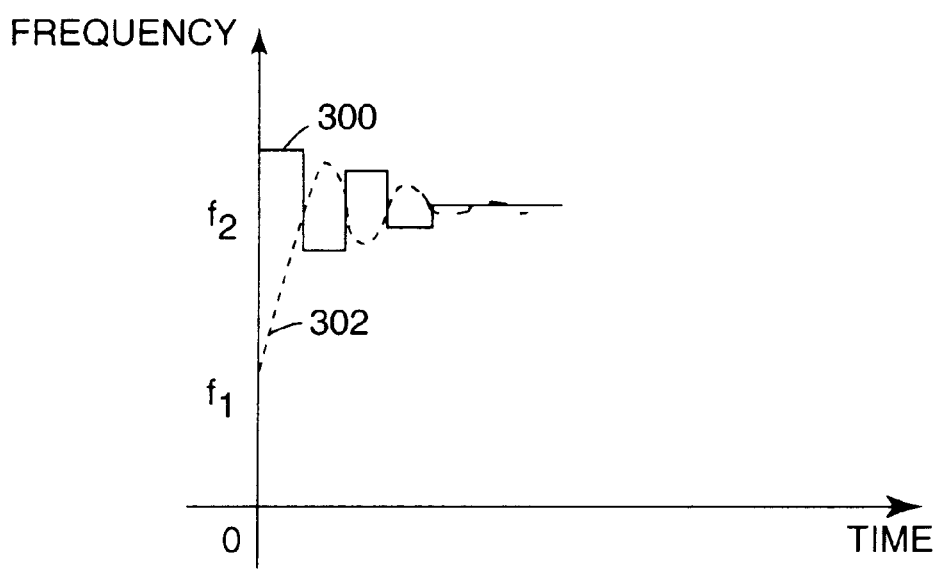
FIG. 3 shows a step response.

FIG. 3 shows an example illustrating the form of a step response. The horizontal axis of the figure represents time and the vertical axis the output frequency $f_{DDs}$ of the direct digital synthesizer. The frequency is switched from a first frequency $f_1$ to a second frequency $f_2$ by several small steps so that an oscillation pattern designated by a continuous line 300 in the figure is formed. In other words, the intention is to counteract the phase-locked loop oscillation of the form shown by a broken line 302 in the figure.

Figure 4:
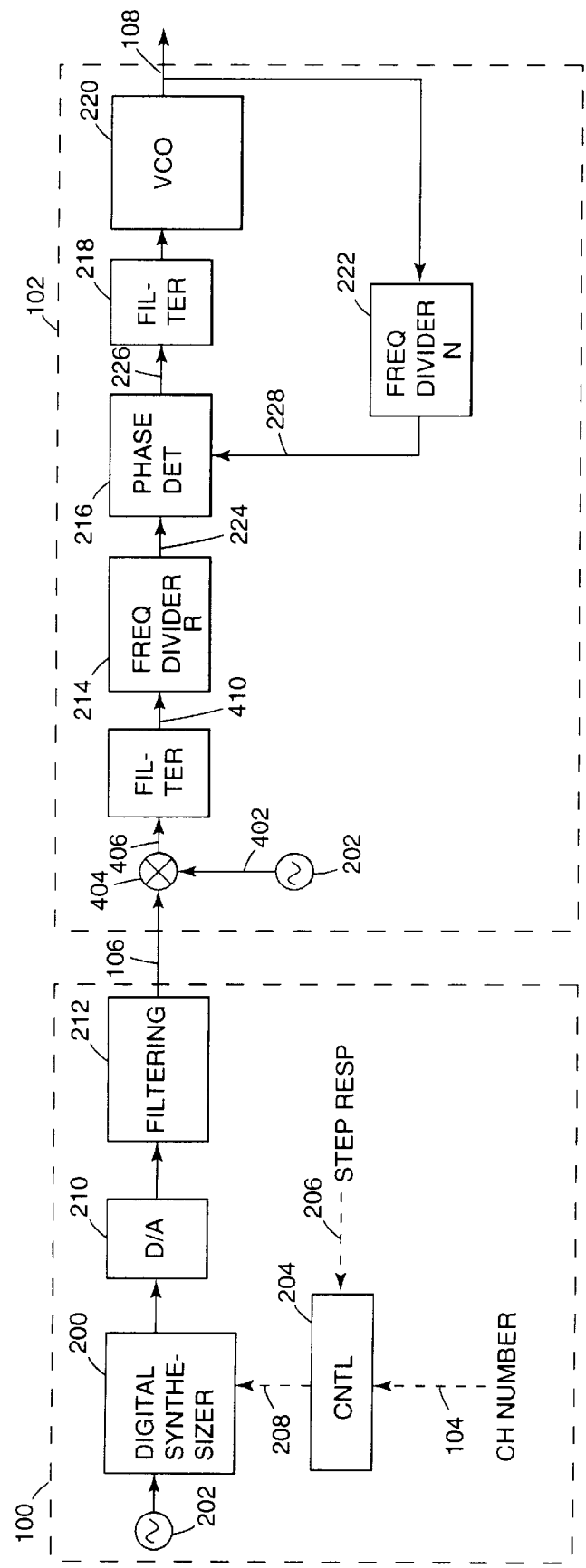
FIG. 4 shows a second example of the structure of the frequency synthesizer of the invention.

Let us next study the frequency synthesizer according to a second preferred embodiment of the invention shown in FIG. 4. The frequency synthesizer of the invention comprises, as above, a direct digital synthesizer 100 and a phase-locked loop 102, coupled in series. The structure of the direct digital synthesizer 100 is as previously described, i.e. it comprises an actual synthesizer block 200, an oscillator or a corresponding frequency source 202 and control means 204 for controlling the operation of the synthesizer block 200. Information 104 indicating the frequency the synthesizer should generate is applied as an input to the control means. A second input 206 is the desired step response at the output of the direct digital synthesizer 100. The direct digital synthesizer further comprises a D/A converter 210 and a filter 212. The output signal $f_{DDS}$ 106 of the synthesizer is applied to the phase-locked loop 102.

The phase-locked loop 102 comprises a local oscillator 400 for generating a desired frequency $f_{LO}$ 402. The output signal 402 of the local oscillator is applied to a mixer 404 in which $f_{LO}$ and the output signal $f_{DDS}$ of the direct digital synthesizer are multiplied to achieve the frequency conversion. The multiplied signal 406 is further applied to a filter 408 which filters undesired frequencies from the signal, generally passing through only either the frequency $f_{LO}+f_{DDS}$ or $f_{LO}-f_{DDS}$. The output signal of the filter is further applied to a first frequency divider 214 which divides the signal by a division number R to obtain a reference signal 224. The reference signal 224 is applied to a phase detector 216. The phase detector compares the reference signal 224 with an output signal 228 of a second frequency divider 222. As a result of the comparison, the output of the phase detector comprises an error signal 226 which is responsive to the phase error of the input signals of the phase detector. This signal is applied to a filter 218. After filtering, the error signal is applied to a voltage-controlled oscillator 220, which is responsive to the error signal and generates an output signal $f_{VCO}$ 108. The output signal is also applied to the second frequency divider 222 which divides the signal by a division number N. The signal 228 divided in the frequency divider is applied as a second input to the phase detector, as was described above. In the above solution the output signal $f_{VCO}$ 108 of the frequency synthesizer accordingly has the following form $$f_{VCO} = \frac{N}{R}(f_{LO} \pm f_{DDS}).$$

Figure 5:
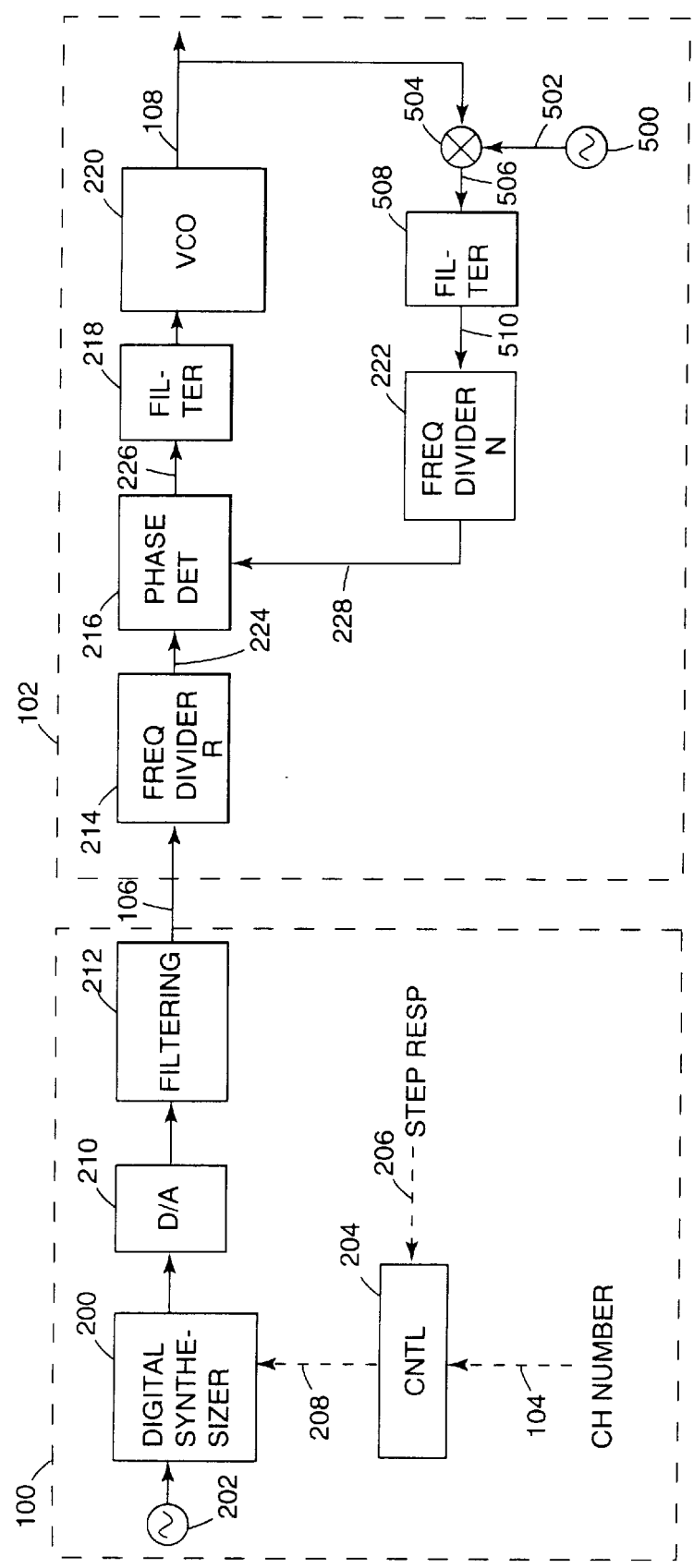
FIG. 5 illustrates a third example of the structure of the frequency synthesizer of the invention.

Let us next study the frequency synthesizer according to another preferred embodiment of the invention shown in FIG. 5. In this case, too, the frequency synthesizer of the invention comprises a direct digital synthesizer 100 and a phase-locked loop 102, coupled in series. The structure of the direct digital synthesizer 100 is as previously described, i.e. it comprises an actual synthesizer block 200, an oscillator or a corresponding frequency source 202 and control means 204 for controlling the operation of the synthesizer block 200. Information 104 indicating the frequency the synthesizer should generate is applied as an input to the control means. A second input 206 is the desired step response at the output of the direct digital synthesizer 100. The direct digital synthesizer further comprises a D/A converter 210 and a filter 212. The output signal fDDs 106 of the synthesizer is applied to the phase-locked loop 102.

The phase-locked loop 102 comprises a frequency divider 214, which divides the signal by a division number R to obtain a reference signal 224. The reference signal 224 is applied to a phase detector 216. The phase detector compares the reference signal 224 with an output signal 228 of a second frequency divider 222. As a result of the comparison, the output of the phase detector comprises an error signal 226 which is responsive to the phase error of the input signals of the phase detector. This signal is applied to a filter 218. After filtering, the error signal is applied to a voltage-controlled oscillator 220, which is responsive to the error signal and generates an output signal $f_{VCO}$ 108.

The phase-locked loop 102 further comprises a local oscillator 500 for generating a desired frequency $f_{Lo}$ 502. The output signal 502 of the local oscillator and the output signal 108 of the voltage-controlled oscillator are applied to a mixer 504 in which $f_{Lo}$ and the output signal $f_{VCO}$ of the voltage-controlled oscillator are multiplied to achieve the desired frequency conversion. The multiplied signal 506 is further applied to a filter 508 which removes harmonic frequencies from the signal. The output signal 510 of the filter now has the form $|f_{jVCO}-f_{Lo}|$, and it is applied to the second frequency divider 222 which divides the signal by a division number N. The signal 228 divided in the frequency divider is applied as a second input to the phase detector 216. In the above solution the output signal $f_{VCO}$ 108 of the frequency synthesizer has the following form $$f_{VCO} = f_{LO} \pm \frac{N}{R} f_{DDS}.$$

The above alternative embodiments only serve as examples. The inventive idea, i.e. predistorting the switching step when the frequency of a signal at the input of a phase-locked loop is switched, can be applied to various frequency synthesizers comprising a direct digital synthesizer and a phase-locked loop. Accordingly, although the invention has been described above with reference to the examples according to the attached drawings, it is obvious that the invention is not restricted thereto, but can be modified in a variety of ways within the scope of the inventive idea disclosed in the attached claims.

What is claimed is:

1. A frequency synthesizer having a controllable output signal frequency and comprising a direct digital synthesizer (100) having an output signal coupled to the input of a phase-locked loop (102), wherein the direct digital synthesizer (100) comprises a controller (204) for controlling the frequency of the direct digital synthesizer (100) from a first frequency to a second frequency stepwise in such a manner that the settling time of the phase locked loop (102) is minimized.

2. The frequency synthesizer as claimed in claim 1, wherein:

the direct digital synthesizer (100) comprises a digital synthesizer (200) having an output signal the frequency of which is determined by the controller (204), the output of the digital synthesizer (200) being coupled to a digital/analog converter (210) having an output functionally coupled a filter (212) for removing signal components; and the phase-locked loop (102) comprises a first frequency divider (214) for generating a reference signal (224), the output of filter (212) being coupled to the first frequency divider (214), the output of the first frequency divider (214) being coupled to a phase detector (216) for generating an error signal on the basis of the reference signal and a second signal (228), the output of phase detector (216) being coupled to a filter (218) for removing signal components from the error signals, the output of the filter (218) being coupled to a voltage-controlled oscillator (220) which is responsive to the filtered error signal, and the output of the oscillator (220) being coupled to a second frequency divider (222) which divides the oscillator output signal (108) which comprises the second signal (228).

3. The frequency synthesizer as claimed in claim 2, wherein the phase-locked loop 102 comprises:

an oscillator (400) for generating a local frequency (402); and a mixer (404) for multiplying the output signal (106) of the direct digital synthesizer (100) with the local frequency (402), the mixer (404) having an output signal (406) functionally coupled to the input of the first frequency divider (214) via a filter (408).

4. The frequency synthesizer as claimed in claim 2, wherein the phase-locked loop (102) comprises an oscillator (500) for generating a local frequency (502) and a mixer (504) which multiplies an output signal (108) of the voltage-controlled oscillator (220) with the local frequency (502) the output signal (506) of the mixer (504) being functionally coupled to the input of the second frequency divider (222) via a filter (508).

5. A method of controlling a frequency synthesizer, comprising:

generating a first frequency by means of a direct digital synthesizer (100), and generating a second frequency by means of a phase-locked loop (102), the first frequency being an input signal of the phase-locked loop (102), and an output signal of the phase-locked loop at the second frequency being an output signal of the frequency synthesizer, wherein, in order to change the second frequency, the direct digital synthesizer (100) is controlled so that the first frequency changes stepwise in such a manner that the settling time of the phase locked loop (102) is minimized.

6. A method as claimed in claim 5, wherein the signal having the first frequency is generated in a digital synthesizer (200), the signal is converted into analog form, signal components are filtered from the signal, and the frequency of the digital synthesizer (200) is controlled by a controller (204) coupled to the digital synthesizer (200) in accordance with a step response (206) at an input to the controller (204).

7. A method as claimed in claim 5, wherein the output signal of the direct digital synthesizer is subjected to a frequency conversion in the phase-locked loop (102) by multiplying the output signal of the direct digital synthesizer by a frequency generated in a local oscillator (400, 500).

\* \* \* \* \*